(12) United States Patent
Liger

(10) Patent No.: US 7,842,533 B2
(45) Date of Patent: Nov. 30, 2010

(54) ELECTROMAGNETIC RADIATION SENSOR AND METHOD OF MANUFACTURE

(75) Inventor: Matthieu Liger, San Francisco, CA (US)

(73) Assignee: Robert Bosch GmbH, Stuttgart (DE)

( * ) Notice: Subject to any disclaimer, the term of this patent is extended or adjusted under 35 U.S.C. 154(b) by 137 days.

(21) Appl. No.: 12/349,860

(22) Filed: Jan. 7, 2009

(65) Prior Publication Data
US 2010/0171190 A1 Jul. 8, 2010

(51) Int. Cl.
*H01L 21/00* (2006.01)
(52) U.S. Cl. .................. 438/69; 257/232; 257/E27.133
(58) Field of Classification Search .................. 438/48, 438/57, 69, 72; 257/232, 233, 234, E27.133, 257/E27.143
See application file for complete search history.

(56) References Cited

U.S. PATENT DOCUMENTS

| 5,021,663 | A | 6/1991 | Hornbeck |
| 5,260,225 | A | 11/1993 | Liu et al. |
| 5,288,649 | A | 2/1994 | Keenan |
| RE36,706 | E | 5/2000 | Cole |
| 6,515,285 | B1 | 2/2003 | Marshall et al. |
| 6,690,014 | B1 * | 2/2004 | Gooch et al. ............. 250/338.4 |
| 7,148,481 | B2 | 12/2006 | Vilain |
| 7,288,765 | B2 | 10/2007 | Vilain |
| 2003/0020017 | A1 * | 1/2003 | Cole ....................... 250/338.1 |
| 2005/0275750 | A1 | 12/2005 | Akram et al. |
| 2007/0170359 | A1 | 7/2007 | Syllaios et al. |
| 2007/0176104 | A1 | 8/2007 | Geneczko et al. |
| 2007/0247401 | A1 * | 10/2007 | Sasagawa et al. ............. 345/84 |

FOREIGN PATENT DOCUMENTS

| EP | 1956658 | 8/2008 |
| WO | 02088648 | 11/2002 |
| WO | 2004025694 | 3/2004 |

OTHER PUBLICATIONS

K.C. Liddiard, Application of Interferometric Enhancement to Self-Absorbing Thin Film Thermal IR Detectors, 1993, Infrared Physics and Technology., vol. 34, No. 4, pp. 379-387 (9 pages).
Riikka L. Puurunen, Surface chemistry of atomic layer deposition: A case study for the trimethylaluminum/water process, Journal of Applied Physics 97, 121301 (2005), 52 pages.
R. A. Wood, High-Performance Infrared Thermal Imaging with Monolithic Silicon Focal Planes Operating at Room Temperature, (c) 1993 IEEE, 3 pages.
Biener et al., Metallic subwavelength structures for a broadband infrared absorption control, (c) 2007 Optical Society of America, Optics Letters, vol. 32, No. 8, Apr. 15, 2007, pp. 994-996, 3 pages.
International Search Report in corresponding PCT application (i.e., PCT/US2010/020237), mailed May 25, 2010 (5 pages).

* cited by examiner

*Primary Examiner*—Brook Kebede
(74) *Attorney, Agent, or Firm*—Maginot, Moore & Beck

(57) ABSTRACT

A method of forming a semiconductor sensor in one embodiment includes providing a substrate, forming a reflective layer on the substrate, forming a sacrificial layer on the reflective layer, forming an absorber layer with a thickness of less than about 50 nm on the sacrificial layer, forming an absorber in the absorber layer integrally with at least one suspension leg, and removing the sacrificial layer.

22 Claims, 5 Drawing Sheets

ELECTROMAGNETIC RADIATION SENSOR AND METHOD OF MANUFACTURE

FIELD

This invention relates to semiconductor sensor devices and methods of fabricating such devices.

BACKGROUND

Objects at any non-zero temperature radiate electromagnetic energy which can be described either as electromagnetic waves or photons, according to the laws known as Planck's law of radiation, the Stefan-Boltzmann Law, and Wien's displacement law. Wien's displacement law states that the wavelength at which an object radiates the most ($\lambda_{max}$) is inversely proportional to the temperature of the object as approximated by the following equation:

$$\lambda_{max}(\mu m) \approx \frac{3000}{T(K)}$$

Hence for objects having a temperature close to room temperature, most of the emitted electromagnetic radiation lies within in the infrared region. Due to the presence of $CO_2$, $H_2O$, and other gasses and materials, the earth's atmosphere absorbs electromagnetic radiation having particular wavelengths. Measurements have shown, however, that there are "atmospheric windows" where the absorption is minimal. An example of such a "window" is the 8 μm-12 μm wavelength range. Another window occurs at the wavelength range of 3 μm-5 μm. Typically, objects having a temperature close to room temperature emit radiation close to 10 μm in wavelength. Therefore, electromagnetic radiation emitted by objects close to room temperature is only minimally absorbed by the earth's atmosphere. Accordingly, detection of the presence of objects which are either warmer or cooler than ambient room temperature is readily accomplished by using a detector capable of measuring electromagnetic radiation emitted by such objects.

One commonly used application of electromagnetic radiation detectors is for automatically energizing garage door lights when a person or car approaches. Another application is thermal imaging. In thermal imaging, which may be used in night-vision systems for driver assistance, the electromagnetic radiation coming from a scene is focused onto an array of detectors. Thermal imaging is distinct from techniques which use photomultipliers to amplify any amount of existing faint visible light, or which use near infrared (~1 μm wavelength) illumination and near-infrared cameras.

Two types of electromagnetic radiation detectors are "photon detectors" and "thermal detectors". Photon detectors detect incident photons by using the energy of said photons to excite charge carriers in a material. The excitation of the material is then detected electronically. Thermal detectors also detect photons. Thermal detectors, however, use the energy of said photons to increase the temperature of a component. By measuring the change in temperature, the intensity of the photons producing the change in temperature can be determined.

In thermal detectors, the temperature change caused by incoming photons can be measured using temperature-dependant resistors (thermistors), the pyroelectric effect, the thermoelectric effect, gas expansion, and other approaches. One advantage of thermal detectors, particularly for long wavelength infrared detection, is that, unlike photon detectors, thermal detectors do not require cryogenic cooling in order to realize an acceptable level of performance.

One type of thermal sensor is known as "bolometer." Even though the etymology of the word "Bolometer" covers any device used to measure radiation, bolometers are generally understood to be to thermal detectors which rely on a thermistor to detect radiation in the long wavelength infrared window (8 μm -12 μm) or mid-wavelength infrared window (3 μm -5 μm).

Because bolometers must first absorb incident electromagnetic radiation to induce a change in temperature, the efficiency of the absorber in a bolometer relates to the sensitivity and accuracy of the bolometer. Ideally, absorption as close to 100% of incident electromagnetic radiation is desired. In theory, a metal film having a sheet resistance (in Ohms per square) equal to the characteristic impedance of free space, laying over a dielectric or vacuum gap of optical thickness d will have an absorption coefficient of 100% for electromagnetic radiation of wavelength 4d. The following equation shows the expression of the characteristic impedance (Y) of free space:

$$Y = \sqrt{\frac{\mu_0}{\varepsilon_0}}$$

wherein $\varepsilon_0$ is the vacuum permittivity and $\mu_0$ is the vacuum permeability.

The numerical value of the characteristic impedance of free space is close to 377 Ohm. The optical length of the gap is defined as "nd", where n is the index of refraction of the dielectric, air or vacuum.

In the past, micro-electromechanical systems (MEMS) have proven to be effective solutions in various applications due to the sensitivity, spatial and temporal resolutions, and lower power requirements exhibited by MEMS devices. One such application is as a bolometer. Known bolometers use a supporting material which serves as an absorber and as a mechanical support. Typically, the support material is silicon nitride. A thermally sensitive film is formed on the absorber to be used as a thermistor. The absorber structure with the attached thermistor is anchored to a substrate through suspension legs having high thermal resistance in order for the incident electromagnetic radiation to produce a large increase of temperature on the sensor.

The traditional technique used to micromachine suspended members involves the deposition of the material, such as by spin coating or polymer coating using a photoresist, over a "sacrificial" layer, which is to be eventually removed. The deposition of the thin-film metal or semiconductor can be done with a variety of techniques including low-pressure chemical vapor deposition (LPCVD), epitaxial growth, thermal oxidation, plasma-enhanced chemical vapor deposition (PECVD), sputtering, and evaporation.

The know processes, however, have inherent limitations with respect to fabrication of bolometers. For example, in order to retain functionality, silicon wafers must not be exposed to temperatures higher than about 450° C. This temperature limitation eliminates several of the deposition techniques mentioned above.

Additionally, it is very difficult to reliably fabricate a suspended thin-film metal using the traditional deposition techniques of sputtering, evaporation or PECVD due to problems of poor step coverage, thickness uniformity and control, and stress control.

What is needed is an efficient and accurate bolometer. A further need exists for a bolometer that is easy and inexpensive to manufacture.

SUMMARY

In accordance with one embodiment, there is provided a method of forming a semiconductor sensor including providing a substrate, forming a reflective layer on the substrate, forming a sacrificial layer on the reflective layer, forming an absorber layer with a thickness of less than about 50 nm on the sacrificial layer, forming an absorber in the absorber layer integrally with at least one suspension leg, and removing the sacrificial layer.

In a further embodiment, a complementary metal oxide semiconductor (CMOS) sensor device includes a complementary metal oxide semiconductor (CMOS) substrate, at least one reflective component formed on the substrate, and at least one absorber spaced apart from the at least one reflective component, the at least one absorber formed by atomic layer deposition.

In yet another embodiment, a complementary metal oxide semiconductor (CMOS) sensor device includes a complementary metal oxide semiconductor (CMOS) substrate, at least one reflective component formed on the substrate, and at least one absorber spaced apart from the at least one reflective component, the at least one absorber including a maximum thickness of less than 50 nm and exhibiting a good noise-equivalent temperature difference (NETD).

DESCRIPTION

Figures 1, 2:
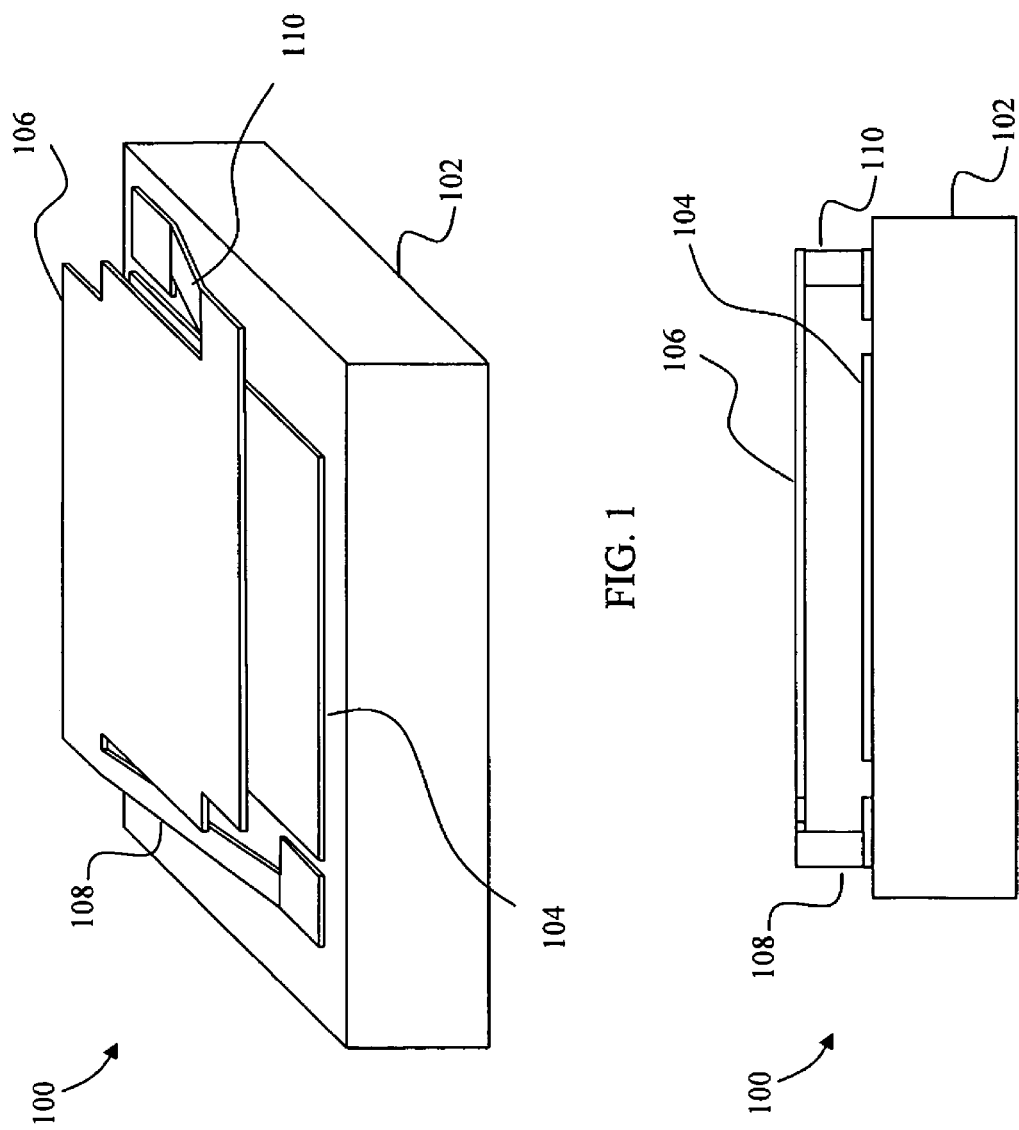
FIG. 1 depicts a top perspective view of a bolometer device with an absorber that provides the function of a thermistor in accordance with principles of the present invention.
FIG. 2 depicts a side plan view of the bolometer of FIG. 1.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a perspective view of a semiconductor sensor 100 which in this embodiment is a bolometer. The sensor 100 may be formed on a complementary metal oxide semiconductor (CMOS) substrate or on another type of substrate. The sensor 100 includes a substrate 102, a mirror 104 and an absorber 106. The substrate 102, which in this embodiment is a silicon wafer that may include one or more sensors 100, includes the electronic circuitry used to access the output of the sensor 100.

The mirror 104 may be, for example, a metal reflector or a multilayer dielectric reflector. The absorber 106 is spaced apart from the mirror 104 by suspension legs 108 and 110. In this embodiment, the gap between the mirror 104 and the absorber 106 is about 2.5 µm. The gap in this embodiment is selected to optimize absorption in the long-wavelength infrared region.

The absorber 106, in addition to absorbing energy from incident photons, is selected to provide a good noise-equivalent temperature difference (NETD). In order for the absorber 106 to have a good NETD, the material selected to form the absorber 106 should exhibit a high temperature coefficient of resistance while exhibiting low excess noise (1/f noise). Semiconductor materials such as vanadium oxide are common in micromachined bolometers due to their high temperature coefficient of resistance. While metals have a lower temperature coefficient of resistance than some semiconductor materials, such as vanadium oxide, metals typically have much lower excess noise than many semiconductor materials.

Accordingly, in one embodiment the absorber 106 comprises metal. Titanium and Platinum are two metal which exhibit desired characteristics. Titanium, for example, exhibits a bulk resistivity of about $7*10^{-7}$ Ohm. Using a bulk resistivity of $7*10^{-7}$ Ohm, the thickness of the absorber 106 to match the impedance of free-space (377 Ohm/square) should be about 1.9 nm. The resistivity of materials formed to a thickness less than about 50 nm, however, can be several times higher than the bulk value. Accordingly, depending on process parameters, the thickness of the absorber 106, if made from titanium, is preferably about 10 nm. Impurities can also be introduced into the absorber 106 during formation in order to tune the resistivity if needed.

Consequently, the thickness of the absorber 106 in this embodiment is about 10 nm and the length of the absorber 106 from the suspension leg 108 to the suspension leg 110 is about 25 μm. This configuration provides a ratio between the thickness of the absorber 106 and the length of the absorber 106 in the order of 1/1000 and the ratio of the thickness of the absorber 106 to the gap width of about 1/100.

The legs 108 and 110 provide mechanical support for the absorber 106 and are designed to have a high thermal resistivity. The total resistance for the sensor measured across the legs 108 and 110 and the absorber 106 is defined by the following equation:

$$R = 2R_s + R_a$$

where $R_s$ is the resistance of each of the suspension legs 108 and 110 and $R_a$ is the resistance of the thin-film absorber 106.

Upon impingement of the absorber 106 with electromagnetic radiation, the temperature of the absorber 106 increases by ΔT. Assuming that the temperature profile along the suspension legs 108 and 110 is linear, the average temperature increase of the suspension legs 108 and 110 is ΔT/2. The electrical resistance of the sensor upon incident radiation changes by an amount ΔR given by:

$$\Delta R = 2\alpha R_s \frac{\Delta T}{2} + \alpha R_a \Delta T$$

where α is the temperature coefficient of resistance of the thin film. Resolving the foregoing equation results in the following equation:

$$\Delta R = \alpha \Delta T (R_s + R_a)$$

Because the legs 108 and 110 are designed to have a high thermal resistivity, the total electrical resistance of the sensor 100 is dominated by that of the suspension legs 108 and 110 (i.e. $R_s$ is much greater than $R_a$) so that:

$$\Delta R \approx \alpha \Delta T R_s$$

Thus, when electromagnetic radiation (e.g. infrared light) reaches the sensor 100, the electromagnetic radiation is absorbed within the thin-film metal of the absorber 106 with an efficiency depending on the resistivity of the absorber 106, quality of the mirror 104, gap height between the absorber 106 and the mirror 104, and radiation wavelength. Upon absorbing the incident radiation, the absorber 106 undergoes an increase in temperature. This temperature increase, in turn, leads to either a decrease or increase of the resistivity of the absorber 106. The absorber 106 is then electrically probed to measure the resistivity of, and thus indirectly measure the amount of incident electromagnetic radiation on, the absorber 106.

Figure 3:
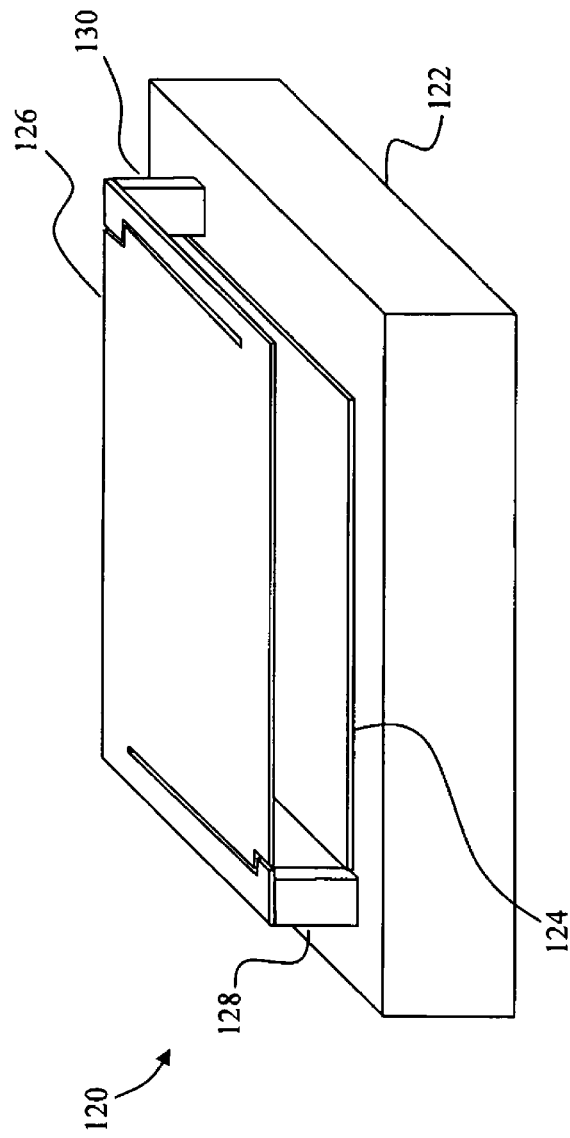
FIG. 3 depicts a top perspective view of another embodiment of a bolometer device with an absorber that provides the function of a thermistor in accordance with principles of the present invention.

An alternative semiconductor sensor 120 is shown in FIG. 3. The semiconductor sensor 120 in this embodiment is also a bolometer which may be formed on a CMOS substrate. The sensor 120 includes a substrate 122, a mirror 124 and an absorber 126. The substrate 122, which in this embodiment is a silicon wafer that may include one or more sensors 120, includes the electronic circuitry used to access the output of the sensor 120.

The absorber 126 is supported by suspension legs 128 and 130. The gap between the absorber 126 and the mirror 124 in this embodiment, however, is controlled by pillars 132 and 134. The pillars 132 and 134, in addition to establishing the gap between the absorber 126 and the mirror 124, further provide electrical contact with the suspension legs 128 and 130. Operation of the sensor 120 is substantially identical to the operation of the sensor 100.

Due to the typical resistivity of deposited metals and semiconductors, the suspended thin-film must have a thickness inferior to 50 nm. Features of the deposition technique known as atomic layer deposition is preferred over traditional micromachining techniques, e.g. sputtering and evaporation. One advantage of this device over the state of the art is its simplicity of fabrication.

Figure 5:
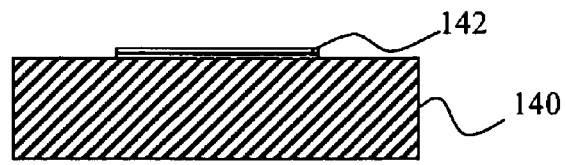
FIG. 5 depicts a cross-sectional view of a substrate, which in this embodiment is a complementary metal oxide semiconductor (CMOS), which may be used to form a device in accordance with principles of the present invention.
Figure 6:
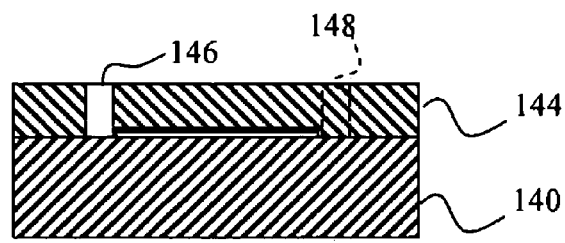
FIG. 6 depicts a cross-sectional view of the substrate of FIG. 5 with a sacrificial layer formed on the substrate and channels etched in the sacrificial layer.
Figure 7:
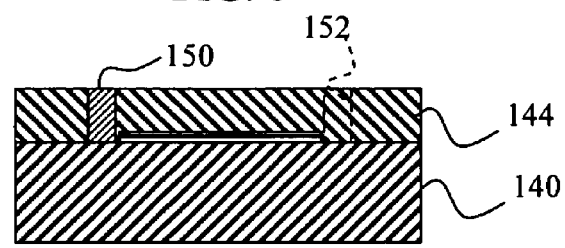
FIG. 7 depicts a cross-sectional view of the substrate of FIG. 6 after conductive pillars have been formed in the etched channels.
Figure 8:
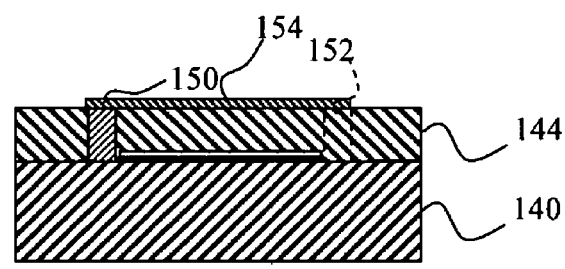
FIG. 8 depicts a cross-sectional view of the substrate of FIG. 7 with an absorber layer deposited on the conductive pillars and on the portion of the sacrificial layer between the conductive pillars.

Fabrication of the sensor 120 begins with preparation of a substrate 140 which is shown in FIG. 5 with a mirror 142 formed upon the substrate 140. A sacrificial layer 144 of material is then deposited on the substrate 140, and channels 146 and 148 are etched (see FIG. 6). Conductive pillars 150 and 152 are then formed in the channels 146 and 148 as shown in FIG. 7. An absorber layer 154 is then formed on the conductive pillars 150 and 152 and over the sacrificial layer 144 between the conductive pillars 150 and 155 (see FIG. 8). An "absorber layer" is a layer of material that exhibits efficient energy absorption from incident photons and good noise-equivalent temperature difference (NETD). As used herein, "good NETD" means that the material functions as a thermistor as well as an absorber.

The absorber layer 154 is preferably formed by atomic layer deposition (ALD). ALD is used to deposit materials by exposing a substrate to several different precursors sequentially. A typical deposition cycle begins by exposing a substrate is to a precursor "A" which reacts with the substrate surface until saturation. This is referred to as a "self-terminating reaction." Next, the substrate is exposed to a precursor "B" which reacts with the surface until saturation. The second self-terminating reaction reactivates the surface. Reactivation allows the precursor "A" to react with the surface. The deposition cycle results, ideally, in one atomic layer being formed, upon which, another layer may be formed. Accordingly, the final thickness of the absorber layer 154 is controlled by the number of cycles a substrate is exposed to.

Typically, the precursors used in ALD include an organometallic precursor and an oxidizing agent such as water vapor or ozone. Atomic layer deposition has gained interest in recent years due to its ability to grow ultra-thin film at relatively low temperature with superior thickness control, uniformity and conformality.

Figure 4:
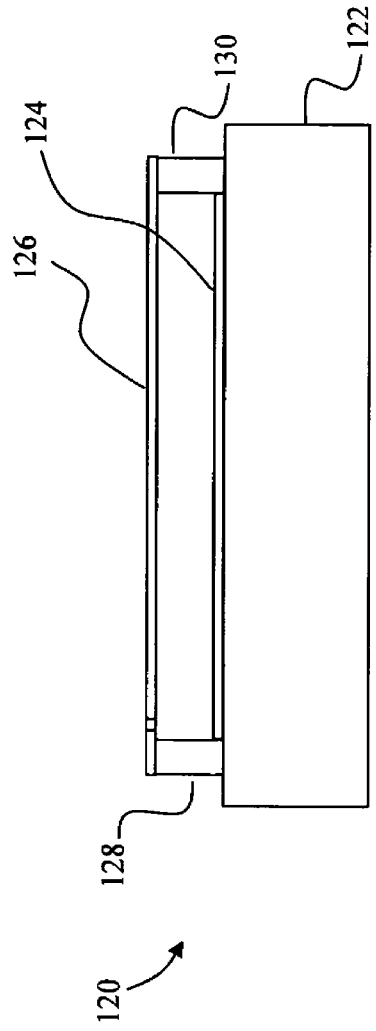
FIG. 4 depicts a side plan view of the bolometer of FIG. 3.
Figure 9:
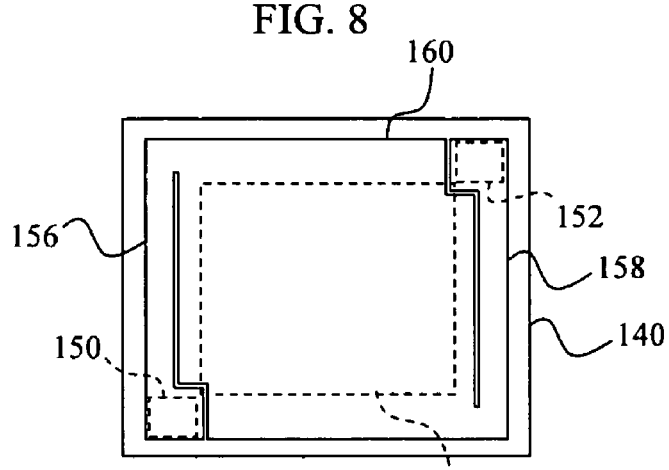
FIG. 9 depicts a top plan view of the substrate of FIG. 8 after trenches have been etched through the absorber layer to the sacrificial layer to form suspension legs and an absorber.

Once the absorber layer 154 is formed, the absorber layer 154 is etched to form suspension legs 156 and 158 and an absorber 160 (FIG. 9). The sacrificial layer 144 is then removed to release the absorber 160, resulting in a configuration as discussed with reference to FIGS. 3 and 4.

Figure 10:
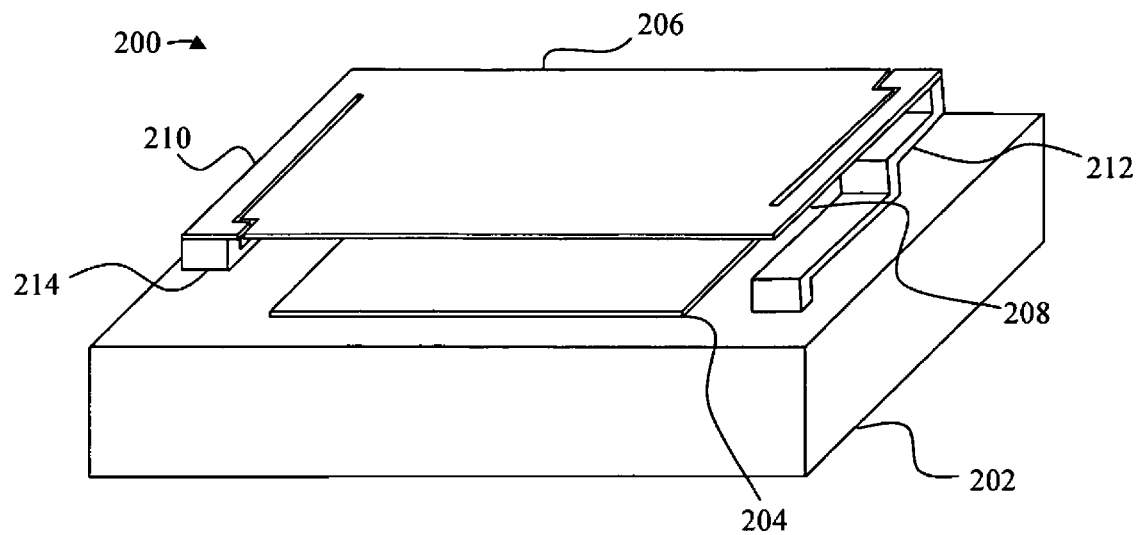
FIG. 10 depicts a top perspective view of another embodiment of a bolometer device with an absorber that provides the function of a thermistor in accordance with principles of the present invention.

An alternative semiconductor sensor 200 is shown in FIG. 10. The semiconductor sensor 200 in this embodiment is also a bolometer which may be formed on a CMOS substrate. The sensor 200 includes a substrate 202, a mirror 204 and an absorber 206. The substrate 202, which in this embodiment is a silicon wafer that may include one or more sensors 200, includes the electronic circuitry used to access the output of the sensor 200.

The absorber 206 is supported by suspension legs 208 and 210. The gap between the absorber 206 and the mirror 204 in this embodiment is controlled by spring pillars 212 and 214. The spring pillars 212 and 214, in addition to establishing the gap between the absorber 206 and the mirror 204, further provide electrical contact with the suspension legs 208 and 210. Operation of the sensor 200 is substantially identical to the operation of the sensor 100.

Figure 12:
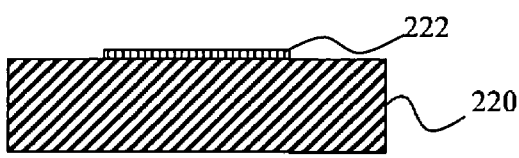
FIG. 12 depicts a cross-sectional view of a substrate, which in this embodiment is a complementary metal oxide semiconductor (CMOS), with a reflective layer formed on the substrate.
Figure 13:
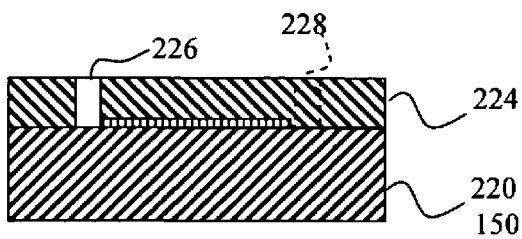
FIG. 13 depicts a cross-sectional view of the substrate of FIG. 12 with a sacrificial layer formed on the substrate and channels etched in the sacrificial layer.
Figure 14:
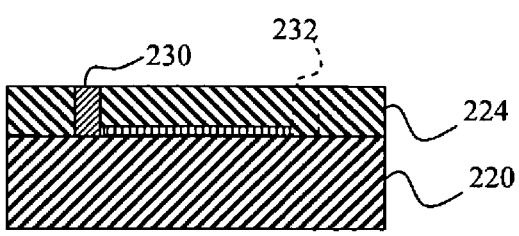
FIG. 14 depicts a cross-sectional view of the substrate of FIG. 13 after base portions of conductive spring pillars have been formed in the etched channels.
Figure 15:
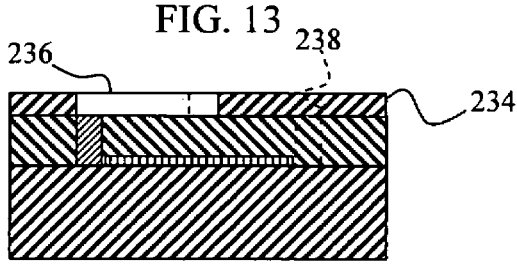
FIG. 15 depicts a cross-sectional view of the substrate of FIG. 14 with another sacrificial layer formed on the substrate and channels etched in the sacrificial layer.
Figure 16:
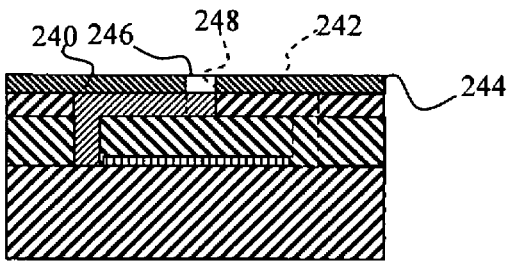
FIG. 16 depicts a cross-sectional view of the substrate of FIG. 15 after lower cross portions of conductive spring pillars have been formed in the etched channels and another sacrificial layer formed on the substrate and channels etched in the sacrificial layer.
Figure 17:
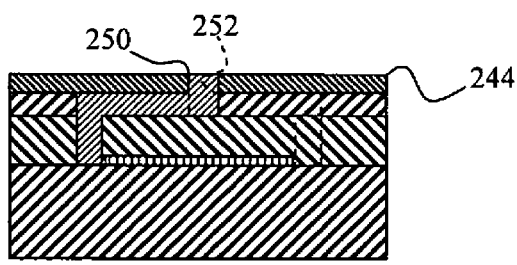
FIG. 17 depicts a cross-sectional view of the substrate of FIG. 16 after center upright portions of conductive spring pillars have been formed in the etched channels.

Fabrication of the sensor 200 begins with preparation of a substrate 220 which is shown in FIG. 12 with a mirror 222 formed upon the substrate 220. A sacrificial layer 224 of material is then deposited on the substrate 220, and channels 226 and 228 are etched (see FIG. 13). The base portions 230 and 232 of the conductive pillars are then formed in the channels 226 and 228 as shown in FIG. 14. Another sacrificial layer 234 of material is then deposited on the sacrificial layer 224, and channels 236 and 238 are etched (see FIG. 15). After lower cross portions 240 and 242 of the conductive pillars are formed in the channels 236 and 238 (see FIG. 16) a sacrificial layer 244 of material is then deposited on the sacrificial layer 224, and channels 246 and 248 are etched. Middle uprights 250 and 252 are then formed in the channels 236 and 238 (FIG. 17).

Figure 18:
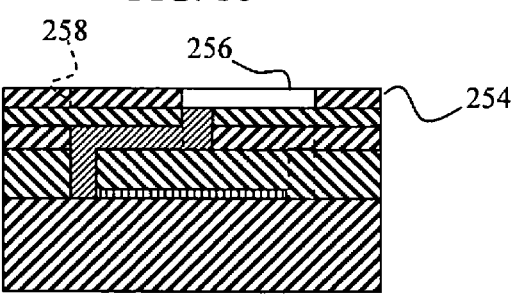
FIG. 18 depicts a cross-sectional view of the substrate of FIG. 15 with another sacrificial layer formed on the substrate and channels etched in the sacrificial layer.
Figure 19:
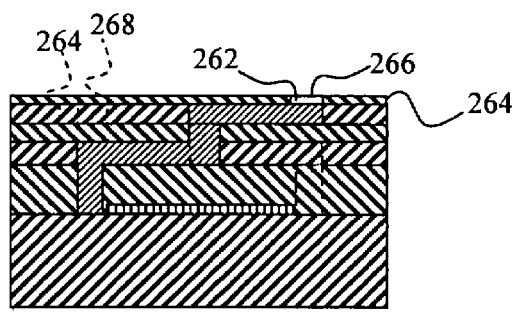
FIG. 19 depicts a cross-sectional view of the substrate of FIG. 18 after upper cross portions of conductive spring pillars have been formed in the etched channels and another sacrificial layer formed on the substrate and channels etched in the sacrificial layer.
Figure 20:
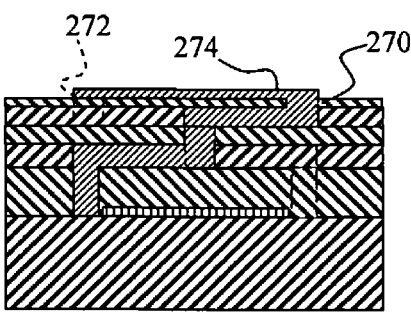
FIG. 20 depicts a cross-sectional view of the substrate of FIG. 19 after upper upright portions of conductive spring pillars have been formed in the etched channels and an absorber layer deposited on the conductive spring pillars and on the portion of the sacrificial layer between the conductive pillars.
Figure 21:
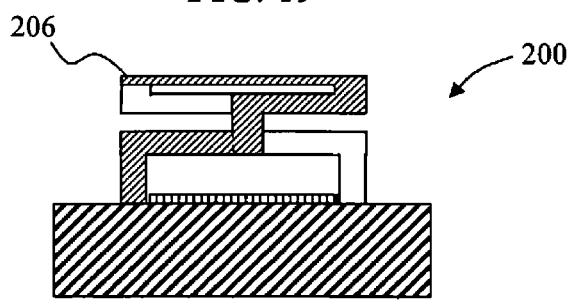
FIG. 21 depicts a cross-sectional view of the device of FIG. 20 with the sacrificial layers removed.

Another sacrificial layer 254 of material is then deposited on the sacrificial layer 244, and channels 256 and 258 are etched (see FIG. 18). After upper cross portions 260 and 262 of the conductive pillars are formed in the channels 256 and 258 (see FIG. 19) a sacrificial layer 264 of material is then deposited on the sacrificial layer 254, and channels 266 and 268 are etched. Top uprights 270 and 272 are then formed in the channels 266 and 268 (FIG. 20) and an absorber layer 274 is then formed on the top uprights 270 and 272 and over the sacrificial layer 264 between the conductive pillars Top uprights 270 and 272.

Figure 11:
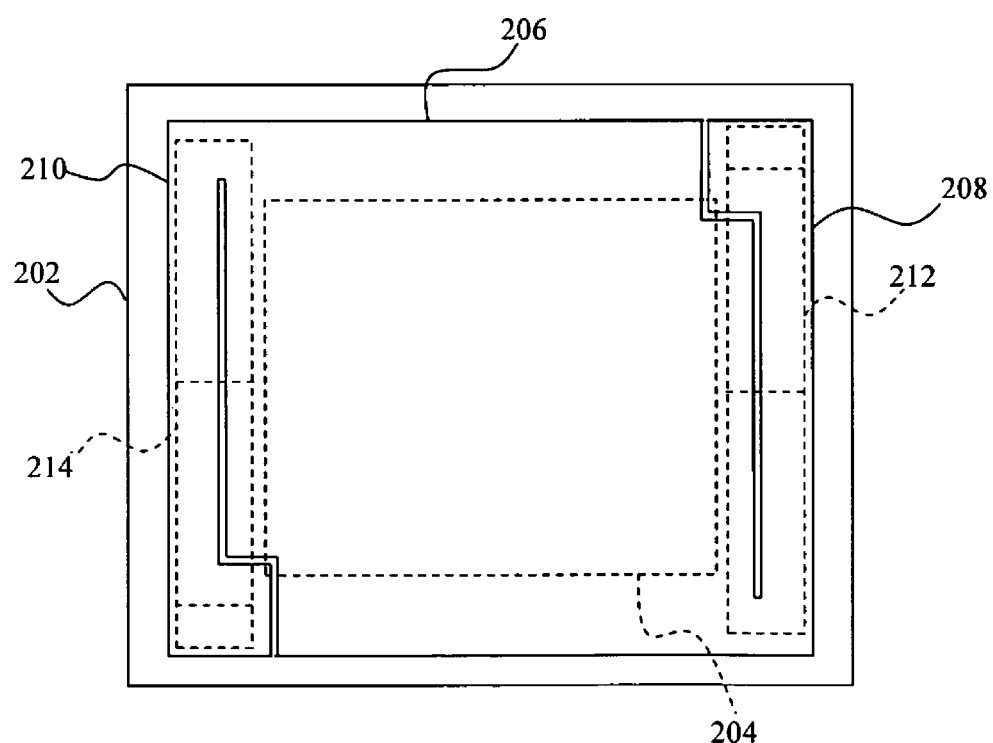
FIG. 11 depicts a top plan view of the device of FIG. 10.

Once the absorber layer 274 is formed, the absorber layer 274 is etched to form suspension legs (see legs 208 and 210 of FIG. 11) and the absorber (absorber 206 of FIG. 11). The sacrificial layers 224, 234, 244, 254, and 264, which may be the same material, are then removed to release the absorber 206 (FIG. 20), resulting in a configuration as discussed with reference to FIGS. 10 and 11.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A method of forming a semiconductor sensor comprising:

providing a substrate;
forming a reflective layer on the substrate;
forming a sacrificial layer on the reflective layer;
forming an absorber layer with a thickness of less than about 50 nm on the sacrificial layer;
forming an absorber in the absorber layer integrally with at least one suspension leg; and
removing the sacrificial layer.

2. The method of claim 1, further comprising:
forming at least one channel in the sacrificial layer; and
forming at least one conductive pillar within the at least one channel, wherein forming an absorber comprises forming at least a portion of the at least one suspension leg on the at least one conductive pillar.

3. The method of claim 1, wherein forming an absorber layer comprises forming an absorber layer with a thickness of about 10 nm on the sacrificial layer.

4. The method of claim 1, wherein forming an absorber layer comprises:
exposing a surface of the sacrificial layer to a first self-terminating reactant; and
exposing the surface of the sacrificial layer to a second self-terminating reactant after exposing the surface of the sacrificial layer to the first self-terminating reactant.

5. A complementary metal oxide semiconductor (CMOS) sensor device comprising:
a complementary metal oxide semiconductor (CMOS) substrate;
at least one reflective component formed on the substrate; and
at least one absorber spaced apart from the at least one reflective component, the at least one absorber formed by atomic layer deposition.

6. The sensor device of claim 5, wherein the at least one absorber has a maximum thickness of less than 50 nm.

7. The sensor device of claim 6, wherein the at least one absorber has a maximum thickness of about 10 nm.

8. The sensor device of claim 6, wherein the at least one absorber is spaced apart from the at least one reflective component by about 2.5 μm.

9. The sensor device of claim 5, further comprising:
at least one electrically conductive pillar extending upwardly from the CMOS substrate; and
at least one suspension leg supported by the at least one pillar, the at least one suspension leg supporting the at least one absorber.

10. The sensor device of claim 9, wherein the at least one suspension leg is formed by atomic layer deposition.

11. The sensor device of claim 5, further comprising:
at least one suspension leg extending upwardly from the CMOS substrate, the at least one suspension leg supporting the at least one absorber.

12. The sensor device of claim 11, wherein the at least one suspension leg is formed by atomic layer deposition.

13. The sensor device of claim 5, wherein:
the at least one reflective component comprises a plurality of reflective components; and
the at least one absorber comprises a plurality of absorbers formed by atomic layer deposition.

14. The sensor device of claim 5, wherein the at least one absorber is formed from at least one of the group of metals and their alloys consisting of titanium and platinum.

15. A complementary metal oxide semiconductor (CMOS) sensor device comprising:
a complementary metal oxide semiconductor (CMOS) substrate;

at least one reflective component formed on the substrate; and at least one absorber spaced apart from the at least one reflective component, the at least one absorber including a maximum thickness of less than 50 nm and exhibiting a good noise-equivalent temperature difference (NETD).

16. The sensor device of claim 15, wherein the at least one absorber is formed by atomic layer deposition.

17. The sensor device of claim 16, wherein the at least one absorber has a maximum thickness of about 10 nm.

18. The sensor device of claim 15, wherein the at least one absorber is spaced apart from the at least one reflective component by about 2.5 µm.

19. The sensor device of claim 15, further comprising:
at least one suspension leg supporting the at least one absorber above the at least one reflective component.

20. The sensor device of claim 19, wherein the at least one suspension leg is formed by atomic layer deposition.

21. The sensor device of claim 20, wherein:
the at least one reflective component comprises a plurality of reflective components; and
the at least one absorber comprises a plurality of absorbers formed by atomic layer deposition.

22. The sensor device of claim 15, wherein the at least one absorber is formed from at least one of the group of metals and their alloys consisting of titanium and platinum.

* * * * *